(12) United States Patent
Takukusaki et al.

(10) Patent No.: US 7,935,899 B2
(45) Date of Patent: May 3, 2011

(54) CIRCUIT DEVICE AND METHOD OF MANUFACTURING THE SAME

(75) Inventors: Sadamichi Takukusaki, Ota (JP); Noriaki Sakamoto, Midori (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 394 days.

(21) Appl. No.: 12/064,996

(22) PCT Filed: Aug. 30, 2006

(86) PCT No.: PCT/JP2006/317605
§ 371 (c)(1),
(2), (4) Date: Feb. 27, 2008

(87) PCT Pub. No.: WO2007/026945
PCT Pub. Date: Mar. 8, 2007

(65) Prior Publication Data
US 2009/0135572 A1    May 28, 2009

(30) Foreign Application Priority Data
Aug. 31, 2005    (JP) .................. 2005-252187

(51) Int. Cl.
*H01L 23/48* (2006.01)
(52) U.S. Cl. ........ 174/527; 174/521; 174/529; 361/803; 361/807; 361/810; 361/813
(58) Field of Classification Search ............. 361/760, 361/761, 763, 765, 772, 782, 783, 807, 808, 361/762, 764, 766–768, 777, 803, 810–812, 361/784, 778, 779, 600, 837, 679.01, 813, 361/774; 174/520, 521, 524, 527–529, 533–535, 538, 541, 564, 260, 76, 50.52, 50.55, 50.56, 59, 50.6, 64, 549–558; 257/E23.066, E23.031, E23.042, E23.049, E23.052, E23.056, E23.057, E23.06, E23.141
See application file for complete search history.

(56) References Cited

U.S. PATENT DOCUMENTS

| | | | |
|---|---|---|---|
| 4,942,453 A | | 7/1990 | Ishida et al. |
| 5,083,189 A | * | 1/1992 | Sawaya .................. 257/791 |
| 5,559,374 A | * | 9/1996 | Ohta et al. .............. 257/723 |

(Continued)

FOREIGN PATENT DOCUMENTS
JP    61-97895    5/1986
(Continued)

OTHER PUBLICATIONS

Chinese Office Action dated Mar. 20, 2009 (2 pages).
(Continued)

*Primary Examiner* — Dameon E Levi
*Assistant Examiner* — Hoa C Nguyen
(74) *Attorney, Agent, or Firm* — Westerman, Hattori, Daniels & Adrian, LLP

(57) ABSTRACT

Provided is a circuit device in which an electronic circuit to be incorporated therein operates stably. A hybrid integrated circuit device includes multiple circuit boards which are disposed on approximately the same plane. An electronic circuit including a conductive pattern and a circuit element is formed on each top surface of the circuit boards. Furthermore, these circuit boards are integrally supported by a sealing resin. Moreover, a lead connected to the electronic circuit formed on the surface of the circuit board is led out from the sealing resin to the outside.

18 Claims, 6 Drawing Sheets

U.S. PATENT DOCUMENTS

| | | | |
|---|---|---|---|
| 5,703,399 A * | 12/1997 | Majumdar et al. | 257/723 |
| 6,291,880 B1 * | 9/2001 | Ogawa et al. | 257/723 |
| 6,313,520 B1 * | 11/2001 | Yoshida et al. | 257/676 |
| 2005/0231925 A1 * | 10/2005 | Fukuda et al. | 361/760 |
| 2005/0263905 A1 * | 12/2005 | Usul et al. | 257/774 |
| 2008/0030981 A1 * | 2/2008 | Mrakovich et al. | 362/219 |

FOREIGN PATENT DOCUMENTS

| | | |
|---|---|---|
| JP | 04-111458 | 4/1992 |
| JP | 05-102645 | 4/1993 |
| JP | 2001-203314 | 7/2001 |
| JP | 2002-083927 | 3/2002 |
| JP | 2003-031765 | 1/2003 |

OTHER PUBLICATIONS

Chinese Office Action dated Aug. 28, 2009 (1 page).

* cited by examiner

FIG2.A
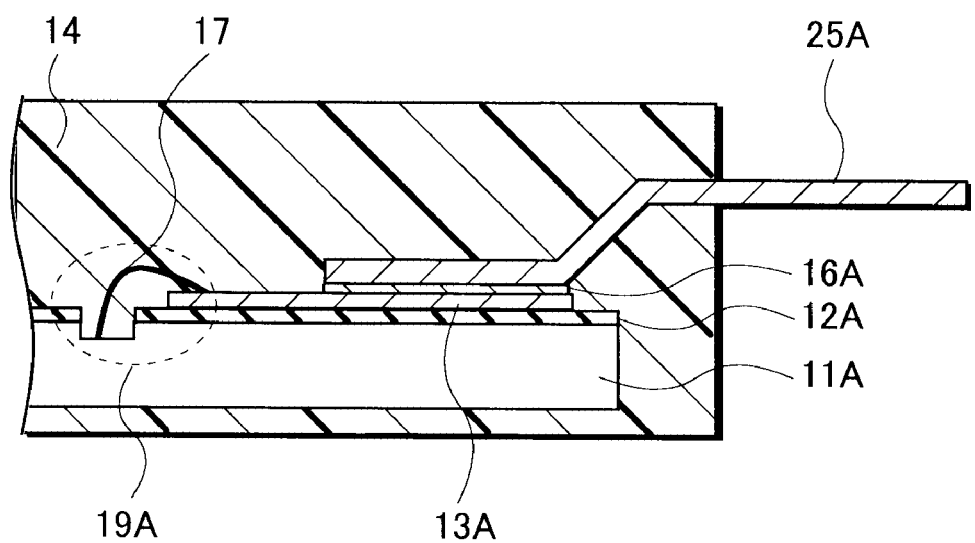
FIG2.B
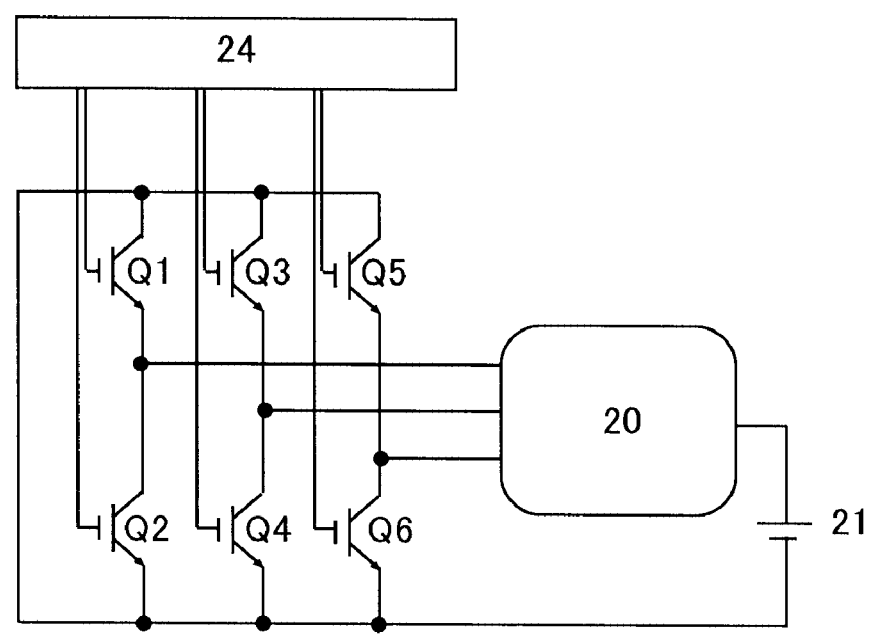

CIRCUIT DEVICE AND METHOD OF MANUFACTURING THE SAME

BACKGROUND OF THE INVENTION

This application claims priority from Japanese Patent Application Number JP 2005-252187 filed on Aug. 31, 2005, the content of which is incorporated herein by reference in its entirety.

FIELD OF THE INVENTION

The present invention relates to a circuit device and a method of fabricating the same. The present invention particularly relates to: a circuit device including multiple circuit boards with electronic circuits which are incorporated in surfaces of the circuit boards; and a method of fabricating the circuit device.

DESCRIPTION OF THE RELATED ART

Description will be given of a configuration of a conventional hybrid integrated circuit device 100 with reference to FIG. 6. This technology is described, for instance, in Japanese Patent Application Publication No. Hei 5 (1993)-102645. A conductive pattern 103 is formed on a surface of a rectangular board 101 with an insulating layer 102 interposed therebetween. A circuit element is fixed to a desired position of the conductive pattern 103 thereby to form a predetermined electronic circuit. Here, a semiconductor element 105A and a chip element 105B serving as the circuit elements are connected to the conductive pattern 103. A lead 104 functioning as an external terminal is connected to a pad 109 which is a part of the conductive pattern 103, and which is formed on the periphery of the board 101. A sealing resin 108 functions to seal the electronic circuit formed on the surface of the board 101.

Nevertheless, the above-described hybrid integrated circuit device 100 has problems as follows. Since the multiple circuit elements are mounted on the single board 101, the circuit elements adversely influence each other. Specifically, suppose a case where there are employed: an LSI which processes a small signal, as the chip element 105B; and a power switching element which performs switching for a large amount of current, as the semiconductor element 105A. In this case, the operation of the switching element causes the electric potential of the metal board 101 to vary, and this operation may deteriorate an electric signal with several mA which passes through the LSI. Furthermore, if an element which generates a large amount of heat is employed as the circuit element, the board 101 is heated entirely, and other circuit elements such as the LSI may be adversely influenced.

Moreover, in fabricating the circuit device, when the electronic circuit to be incorporated in the surface of the board 101 is modified, it becomes necessary to change the pattern form of the conductive pattern 103 and the arrangement of the circuit elements, considerably increasing the production cost.

SUMMARY OF THE INVENTION

The present invention has been made in view of the problems described above. A main object of the present invention is to provide a circuit device in which an electronic circuit to be incorporated operates stably. Moreover, another object of the present invention is to provide a method of fabricating a circuit device flexibly in accordance with a modification of an electronic circuit to be built in.

A circuit device according to the present invention is characterized as follows. Specifically, the circuit device includes: a circuit board; an electronic circuit, having a conductive pattern and a circuit element, formed on the top surface of the circuit board; and a lead, which is electrically connected to the electronic circuit, and which is led out to the outside. A number of the independent circuit boards are provided to the circuit device. The conductive pattern, the circuit element and the lead are provided to each of the circuit boards.

A method of fabricating a circuit device according to the present invention is characterized by including the steps of: preparing a lead frame provided with units including multiple leads; forming a electronic circuit having a conductive pattern and a circuit element on the top surface of the circuit board; connecting the multiple circuit boards to the leads provided in one of the units thereby to cause the lead frame to hold the circuit boards mechanically; and integrally covering the multiple circuit boards with a sealing resin.

BRIEF DESCRIPTION OF THE DRAWINGS

FIG. 2A is a cross-sectional view of the circuit device according to the present invention;

FIG. 2B is a circuit diagram of the circuit device according to the present invention;

DETAILED DESCRIPTION OF THE PREFERRED EMBODIMENTS

First Embodiment

In this embodiment, description will be given of a structure of a hybrid integrated circuit device 10 as an example of a circuit device.

Figure 1A:
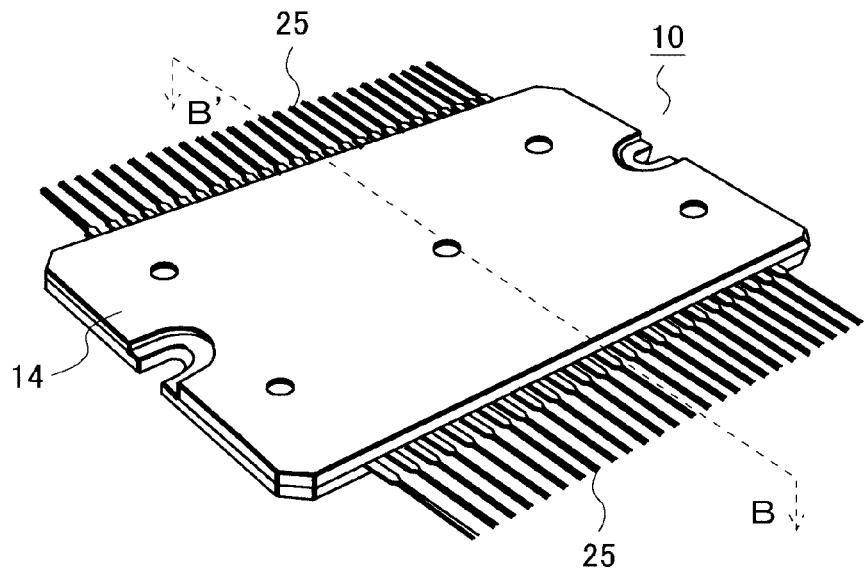
FIG. 1A is a perspective view of a circuit device according to the present invention.
Figure 1B:
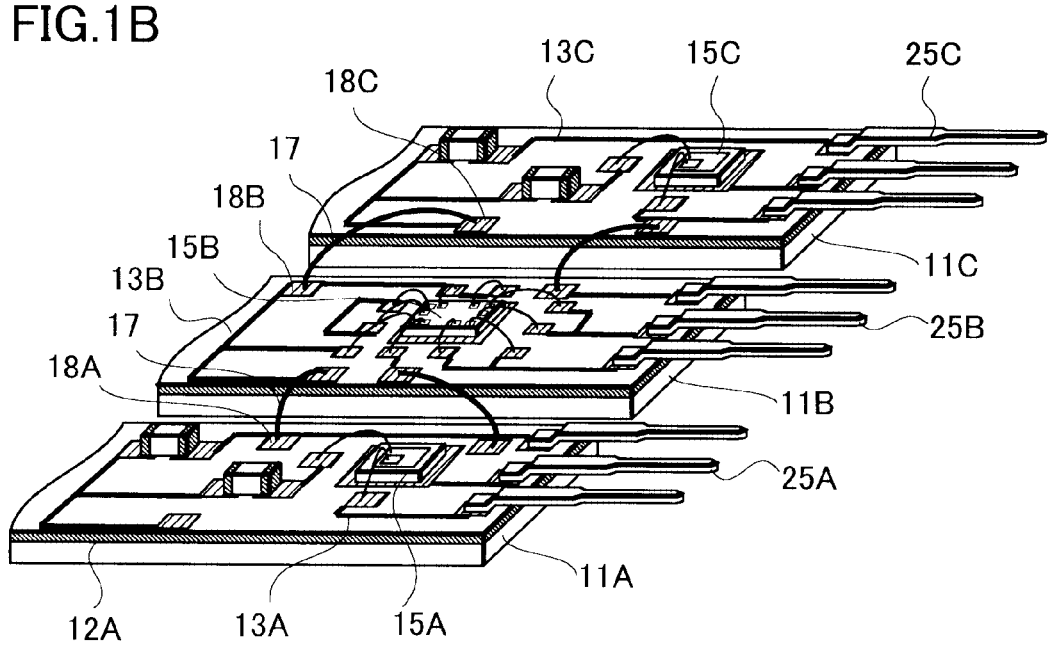
FIG. 1B is a perspective view of the circuit device according to the present invention.

With reference to FIGS. 1A and 1B, description will be given of a configuration of the hybrid integrated circuit device 10 in this embodiment. FIG. 1A is a perspective view of the hybrid integrated circuit device 10 as seen diagonally from above. FIG. 1B is a perspective view of the hybrid integrated circuit device 10, while omitting a sealing resin 14 which seals the entire device.

As shown in FIGS. 1A and 1B, the hybrid integrated circuit device 10 according to this embodiment includes multiple circuit boards 11A, 11B, and 11C which are disposed on approximately the same plane. On each top surface of these circuit boards, an electronic circuit including a conductive pattern and a circuit element is formed. Furthermore, these circuit boards are integrally supported by the sealing resin 14. A lead 25 connected to the electronic circuit formed on the surface of the circuit board is led out from the sealing resin 14 to the outside. The configurations of the circuit boards 11A, 11B, and 11C are basically identical to one another. Thus, hereinafter, the configuration of the circuit board 11A will be described.

The circuit board 11A is a metal board having a metal such as aluminium (Al) and copper (Cu) as the main material. The specific size of the circuit board 11A is, for example, approximately 30 mm in length, 15 mm in width, and 1.5 mm in thickness. When an aluminium board is adopted as the circuit board 11A, an oxide film is formed on both of the main surfaces of the circuit board 11A, and then the circuit boards 11A are anodized.

A side surface of the circuit board 11A is shaped differently, depending on a fabricating method. When the circuit board 11A is fabricated by punching with a press machine, the side surface of the circuit board 11A is shaped into a straight form. Meanwhile, when the circuit board 11A is fabricated by forming a V-shaped dicing groove therein, the side surface of the circuit board 11A is shaped as projecting toward the outside.

An insulating layer 12A is formed to cover the entire top surface of the circuit board 11A. The insulating layer 12A is made of, for example, an epoxy resin in which a filler such as $Al_2O_3$ is filled to a high degree. By mixing the filler in the insulating layer 12A, the heat resistance of the insulating layer 12A is reduced. This allows heat generated from the circuit element built in the device, to be transferred actively to the circuit board 11A. The specific thickness of the insulating layer 12A is, for example, approximately 50 μm.

The back surface of the circuit board 11A may be covered with the insulating layer 12A. Thereby, even when the back surface of the circuit board 11A is exposed to the outside from the sealing resin 14, the back surface of the circuit board 11A can be insulated from the outside.

A conductive pattern 13A is made of a metal such as copper, and is formed on the surface of the insulating layer 12A to form a predetermined electronic circuit. Pads formed of the conductive pattern 13A are disposed on a side where leads 25A are led out. Furthermore, a large number of the pads formed of the conductive pattern 13A are disposed also around a circuit element 15A. The pads and the circuit element 15A are connected to each other with thin metal wires 17. Although the single-layered conductive pattern 13A is illustrated in FIG. 1B, the conductive pattern 13A having multiple layers laminated on the insulating layer 12A may be formed on the top surface of the circuit board 11A. Furthermore, pads 18A are also formed so that the circuit boards 11A can be connected to the other circuit boards 11B and 11C.

As the circuit element 15A to be mounted on the circuit board 11A, an active element and a passive element can be adopted in general. Specifically, it is possible to adopt, as the circuit element 15A, a transistor, an LSI chip, a diode, a chip resistance, a chip capacitor, an inductance, a thermistor, an antenna, an oscillator, and the like. Furthermore, as the circuit element 15A, a package of a resin-sealing type, and the like, can be fixed to the conductive pattern 13A. In the drawing, a chip element and a semiconductor element are illustrated as the circuit element 15A. In this embodiment, a power switching element is employed as the circuit element 15A. This circuit element 15A is controlled by a control element 15B which is a control element mounted on the circuit board 11B.

In this embodiment, the circuit elements are mounted on the surfaces of the multiple circuit boards, and each of the circuit boards is mounted with the circuit element which is different from those on the other circuit boards. As an example, the circuit board 11B disposed in the center of the circuit device 10 is mounted with the circuit element 15B, which is an LSI that functions as the control element. Additionally, the circuit boards 11A and 11C disposed adjacent to the two edges of the circuit board 11B are mounted with the circuit elements 15A and 15C, respectively, which are the switching elements controlled by the circuit element 15B. In this respect, semiconductor elements through which a large amount of current such as 1 A or more flows are adopted as the circuit element 15A and 15C. Specifically, a MOSFET (metal-oxide semiconductor field effect transistor), an IGBT (insulated gate bipolar transistor), an IC (integrated circuit), a bipolar transistor, and the like, can be adopted as the circuit elements 15A and 15C.

One end of the lead 25A is electrically connected to the pad on the circuit board 11A, and the other end of the lead 25A is led out from the sealing resin 14 to the outside. The lead 25A is made of a metal such as copper (Cu), aluminium (Al) or a Fe—Ni alloy as the main component. Here, the leads 25A are connected to the pads formed along two opposing sides of the circuit board 11A. Nonetheless, the leads 25A may be connected to the pads formed along one side or four sides of the circuit board 11A.

The sealing resin 14 is formed by transfer molding with a thermosetting resin or by injection molding with a thermoplastic resin. In this embodiment, the sealing resin 14 may cover the entire circuit board 11A including the back surface thereof, or the back surface of the circuit board 11A may be exposed from the sealing resin 14. Here, the three circuit boards 11A, 11B, and 11C are integrally supported by the sealing resin 14.

The configuration of the circuit board 11A has been described so far, and each configuration of the other circuit boards 11B and 11C, which are built in the hybrid integrated circuit device 10, is basically identical to the configuration of the circuit board 11A. The difference of these circuit boards are the electronic circuits formed on the respective surfaces of the circuit boards.

The electronic circuits formed on the surfaces of the circuit boards 11A, 11B, and 11C are connected to each other with the thin metal wires 17 that serve as a connecting member. Specifically, the pad 18A formed on the surface of the circuit board 11A is connected to a pad 18B formed on the surface of the circuit board 11B with the thin metal wire 17. The pad 18B formed on the surface of the circuit board 11B is connected to a pad 18C formed on the surface of the circuit board 11C with the thin metal wire 17. Meanwhile, the pad 18A on the circuit board 11A may be connected to the pad 18C on the circuit board 11C with the thin metal wire 17. In this case, the thin metal wire 17 is formed to pass over the circuit board 11B in the center of the circuit device. Here, a plate-shaped conductive member such as a lead may be used instead of the thin metal wire 17.

Next, description will be given of a structure of a connecting portion 19A with reference to FIG. 2A. At the connecting portion 19A, the circuit board 11A and the conductive pattern 13A are electrically connected to each other. Connecting portions with the identical forms may also be provided to the other circuit boards 11B and 11C.

The connecting portion 19A is formed in the following way. A part of the insulating layer 12A that covers the top surface of the circuit board 11A is opened so that the circuit board 11A is partially exposed. Then, the exposed part of the circuit board 11A is connected to the conductive pattern 13A with the thin metal wire 17.

By providing the connecting portion 19A, it is possible to stabilize the operation of the electronic circuit formed on the top surface of the circuit board 11A. For example, when the electric potential of the conductive pattern 13A differs from that of the circuit board 11A, the insulating layer 12A disposed therebetween may cause parasitic capacitance. As a result, a malfunction of the electronic circuit may occur. In this embodiment, the connecting portion 19A maintains the electric potentials of the conductive pattern 13A and the circuit board 11A to be approximately the same. Thus, the parasitic capacitance is reduced. Therefore, it is possible to stabilize the operation of the electronic circuit, including the conductive pattern 13A and the circuit element 15A which are formed on the top surface of the circuit board 11A.

Furthermore, when the circuit board 11A is connected to an element having a fixed electric potential (for example, a power source potential or ground potential) by using the connecting portion 19A, the electric potential of the circuit board 11A is constantly fixed. This allows the above-described effect of stabilizing the electronic circuit to be further enhanced.

Next, with reference to FIG. 2B, description will be given of an example of the electronic circuit which is built in the hybrid integrated circuit device 10 according to this embodiment. There is illustrated an inverter circuit which drives a 3-phase motor 20. The inverter circuit includes six switching elements Q1 to Q6 controlled by a control circuit 24. The motor 20 is connected to middle points between Q1 and Q2, between Q3 and Q4, and between Q5 and Q6. Control electrodes of the switching elements Q1 to Q6 are connected to the control circuit 24.

In response to a control signal supplied from the control circuit 24, the switching elements Q1 to Q6 perform switching at a predetermined timing to convert a DC power supplied from a power source 21 into an AC power. Then, the converted AC power is supplied to the motor 20, and accordingly the motor 20 is rotated.

The control circuit 24 corresponds to the circuit element 15B which is mounted on the circuit board 11B in FIG. 1B. The switching elements Q1 to Q6 correspond to the circuit elements 15A and 15C which are respectively mounted on the circuit boards 11A and 11C. Thus, when the inverter circuit is built in the hybrid integrated circuit device 10 of this embodiment, the operation of the inverter circuit can be stabilized.

Hereinafter, specific advantages of this embodiment will be described.

According to the hybrid integrated circuit device 10 of this embodiment, even when the electronic circuit to be built therein is modified, the circuit device 10 can be fabricated easily at low cost. To be more specific, in this embodiment, the hybrid integrated circuit device 10 having a predetermined function is formed by combining the circuit boards 11A, 11B and 11C as modules. Here, the circuit board 11B, which is mounted with the circuit element 15B serving as the control element, is combined to the circuit boards 11A and 11C, which are respectively mounted with the circuit elements 15A and 15C serving as the switching elements controlled by this control element 15B. The circuit elements mounted on the respective circuit boards are connected to each other with the thin metal wires 17. Thereby, even when the electronic circuit built in the hybrid integrated circuit device 10 is modified, the circuit device 10 can be fabricated only by altering any one of the circuit boards 11A, 11B, and 11C. For example, assume a case where a modification is made to the control circuit for controlling the operations of the entire circuit. In order to deal with the modification, it is only necessary to replace the circuit board 11B, which is mounted with the circuit element 15B serving as the control element. Moreover, in a case, for example, where the capacity of the switching element is modified, it is only necessary to alter the circuit board 11A or 11C to cope with the modification.

Moreover, in the hybrid integrated circuit device 10 of this embodiment, the circuit element 15A serving as the switching element is mounted on the board different from that on which the circuit element 15B serving as the control element is mounted. Thereby, it is possible to prevent a malfunction of the circuit element 15B due to heat generated from the circuit element 15A. Specifically, since a large amount of current flows through the circuit element 15A serving as the switching element, a large amount of heat is generated therefrom. For this reason, when the circuit elements 15A and 15B are mounted on the same circuit board, the heat generated from the circuit element 15A is transferred to the circuit element 15B through the circuit board having high heat conductivity. As a result, a malfunction may occur in the circuit element 15B. Against this background, in this embodiment, the circuit elements 15A and 15B are mounted on the different circuit boards 11A and 11B. As a result, even when the circuit element 15A generates heat that heats the circuit board 11A on which the circuit element 15A is mounted, the circuit board 11B disposed separately from The circuit board 11A is not heated to a high temperature. Thus, the circuit element 15B serving as the control element is hardly influenced by the heat generated from the circuit element 15A serving as the switching element.

Furthermore, with the above configuration, it is possible to prevent a malfunction of the electronic circuit due to the varying electric potential of the circuit board. Specifically, a high voltage such as several tens of V is applied to a main electrode of the circuit element 15A serving as the switching element. On the other hand, a low voltage such as several V is applied to the circuit element 15B serving as the control element. For this reason, when the two circuit elements are mounted on the same circuit board, the switching operation by the circuit element 15A causes the electric potential of the circuit board to vary, and this operation may cause the circuit element 15B serving as the control element to malfunction. In this embodiment, the circuit element 15A serving as the switching element and the circuit element 15B serving as the control element are respectively mounted on the separate circuit boards 11A and 11B. Thus, even when the circuit element 15A performs a switching operation, only the electric potential of the circuit board 11A varies, which is mounted with the circuit element 15A. The electric potential of the circuit board 11B does not vary. As a result, the circuit element 15B serving as the control element does not receive an electrically adverse influence from the circuit element 15A serving as the switching element.

Still furthermore, with the configuration in this embodiment, it is possible to suppress adverse influences between the different types of the electric circuits that are built in the same circuit device. For example, suppose a case where an active filter and the inverter circuit are built in the same circuit device. The active filter is a circuit which is susceptible to an adverse influence of a noise. For this reason, it is necessary to suppress the transferring of a noise, which is generated from a high-frequency switching element in the inverter circuit, to the active filter. By employing this embodiment, when the active filter and the inverter circuit are formed on the top surfaces of the separate boards, they can be separated from each other. Thereby, it is possible to suppress the noise generated from the inverter circuit from adversely influencing the active filter.

Second Embodiment

In this embodiment, with reference to FIGS. 3A to 5B, description will be given of a method of fabricating a hybrid integrated circuit device.

Figure 3A:
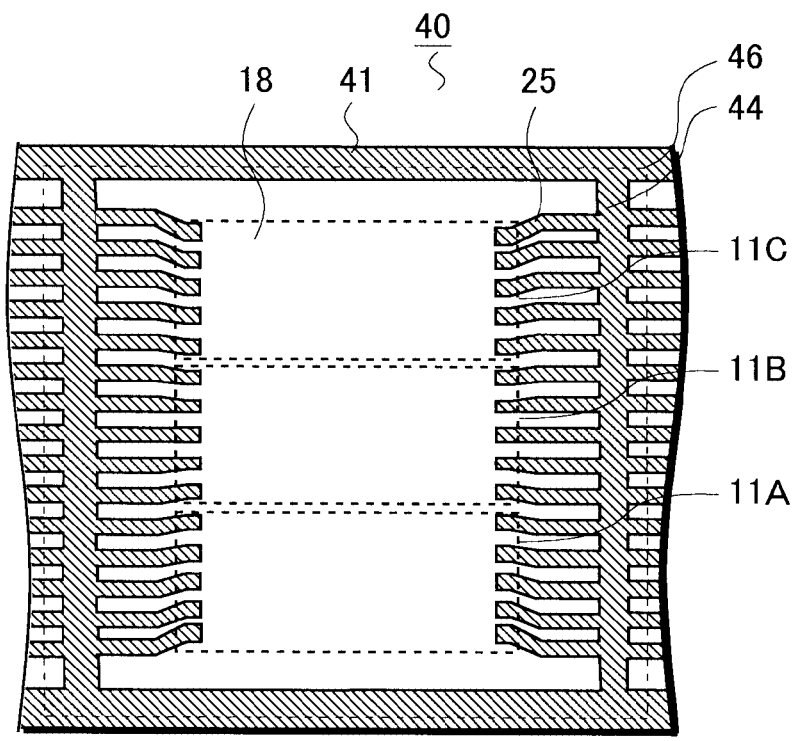
FIG. 3A is a plan view for explaining a method of fabricating a circuit device according to the present invention.
Figure 3B:
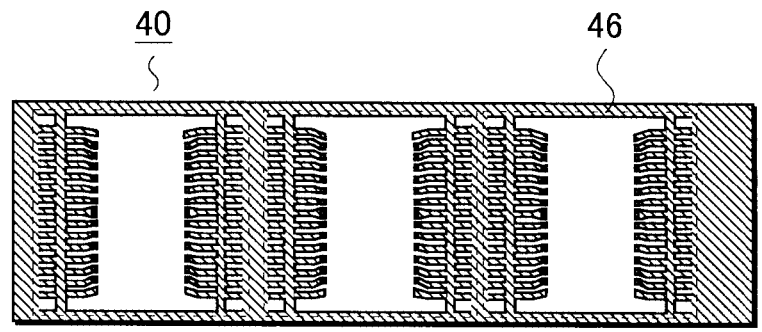
FIG. 3B is a plan view for explaining the method of fabricating a circuit device according to the present invention.

As shown in FIGS. 3A to 3B, firstly, there is prepared a lead frame 40 provided with multiple leads 25. FIG. 3A is a plan view showing a single unit 46 provided to the lead frame 40. FIG. 3B is a plan view showing the entire lead frame 40.

As shown in FIG. 3A, the unit 46 includes the multiple leads 25 whose one ends are positioned in regions where the circuit boards 11A, 11b, and 11C are mounted. The leads 25 extend in both right and left directions of the drawing toward the regions where the circuit boards are mounted. The multiple leads 25 are connected to each other with tie-bars 44 elongated from outer rails 41. Thereby, the deformation of the leads 25 is prevented. In this embodiment, the one ends of the leads 25 are fixed on the top surfaces of the circuit boards, and accordingly the tip ends of the leads 25 extend to inner regions of the circuit boards. In this embodiment, three circuit boards 11A, 11B, and 11C are disposed on the single unit 46.

As shown in FIG. 3B, the units 46 with the above-described configuration are disposed on the stripe-shaped lead frame 40, while separated from each other. In this embodiment, the multiple units 46 are provided to the lead frame 40, and steps such as wire-bonding and molding are conducted at once in fabricating a hybrid integrated circuit device. Thereby, the productivity is improved.

Figure 4A:
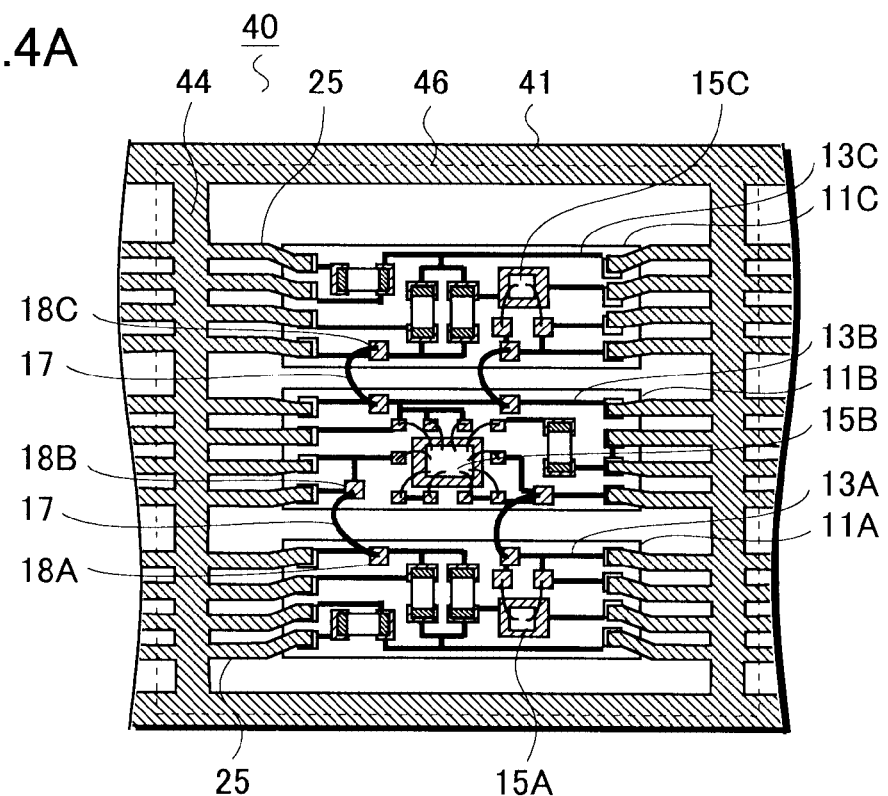
FIG. 4A is a plan view for explaining the method of fabricating a circuit device according to the present invention.
Figure 4B:
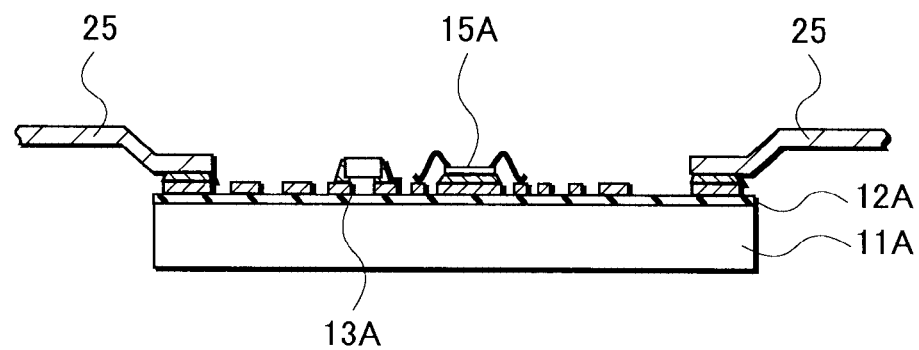
FIG. 4B is a cross-sectional view for explaining the method of fabricating a circuit device according to the present invention.

Subsequently, the circuit boards are fixed to the lead frame 40 as shown in FIGS. 4A and 4B. FIG. 4A is a plan view showing the unit 46 of the lead frame 40. FIG. 4B is cross-sectional views showing the position where the circuit board 11A is fixed.

As shown in FIG. 4A, in this embodiment, the multiple circuit boards are fixed to the single unit 46 as described above. The tip ends of the leads 25 are fixed to pads formed of conductive patterns on the surfaces of these circuit boards with a fixing member such as a solder. Thereby, the circuit boards are fixed to the lead frame 40.

Here, the three circuit boards 11A, 11B, and 11C are fixed to the single unit 46 with the leads 25. Thereby, the relative positions among the three circuit boards 11A, 11B, and 11C can be fixed with the lead frame 40. Specifically, the circuit boards 11A, 11B, and 11C are disposed on approximately the same plane, and separated from each other by predetermined distances. Accordingly, it is not necessary to check the positions of the circuit boards individually in a step of forming a thin metal wire and in a step of resin-sealing. Thus, these steps can be simplified. In the drawing, the three circuit boards 11A, 11B and 11C are disposed on the single unit 46. Alternatively, two circuit boards may be disposed thereon, or four or more circuit boards may be disposed.

In this step of fixing the circuit boards to the unit 46, after the circuit boards 11A, 11B and 11C are mounted with semiconductor elements such as circuit elements 15A, 15B, and 15C, these circuit boards may be fixed to the lead frame 40. Alternatively, after the circuit boards are fixed to the lead frame 40, the mounting of the circuit elements and the formation of the thin metal wires may be conducted.

After the circuit boards 11A, 11B, and 11C are fixed to the lead frame 40, electronic circuits formed on the surfaces of these circuit boards are electrically connected to each other with thin metal wires 17. Specifically, a pad 18A, which is formed on the surface of the circuit board 11A, is connected to a pad 18B, which is formed on the surface of the circuit board 11B, with the thin metal wire 17. Similarly, the pad 18B, which is formed on the surface of the circuit board 11B, is connected to a pad 18C, which is formed on the surface of the circuit board 11C. Here, a plate-shaped conductive member such as a lead may be used instead of the thin metal wire 17.

Figure 5A:
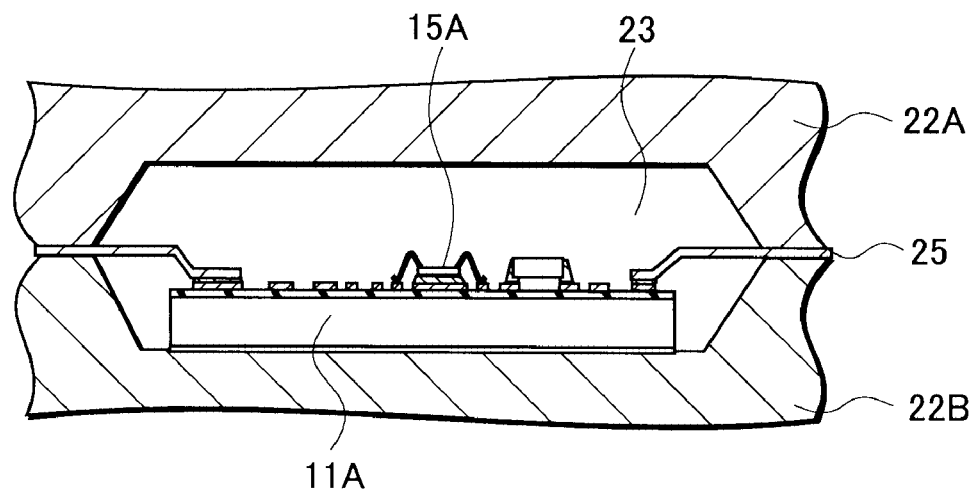
FIG. 5A is a cross-sectional view for explaining a method of fabricating a circuit device according to the present invention.
Figure 5B:
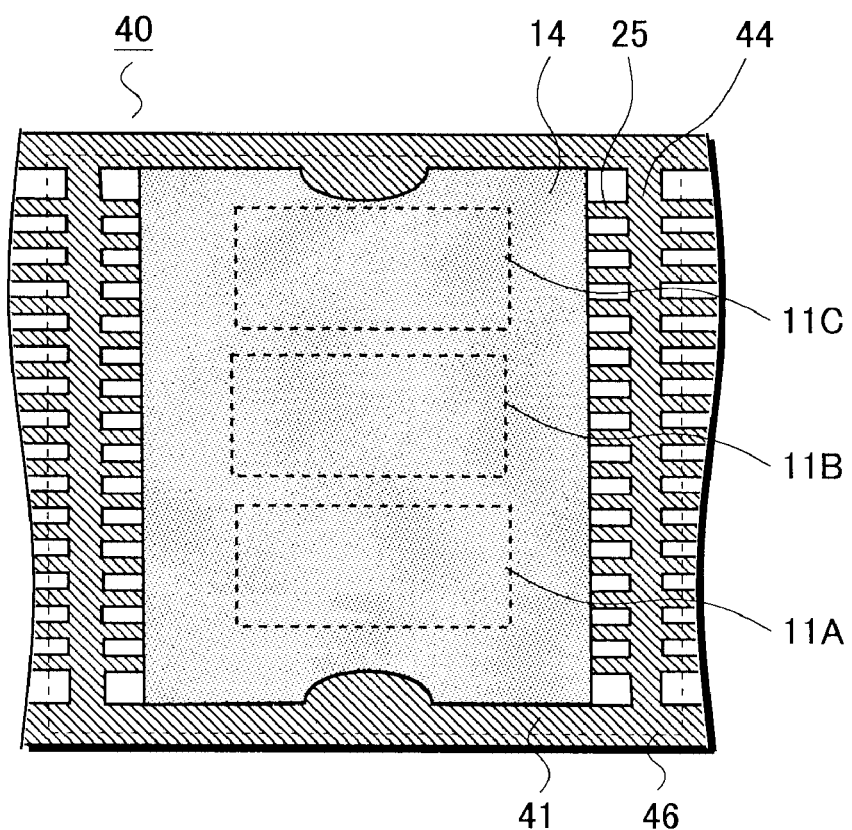
FIG. 5B is a plan view for explaining the method of fabricating a circuit device according to the present invention.
Figure 6:
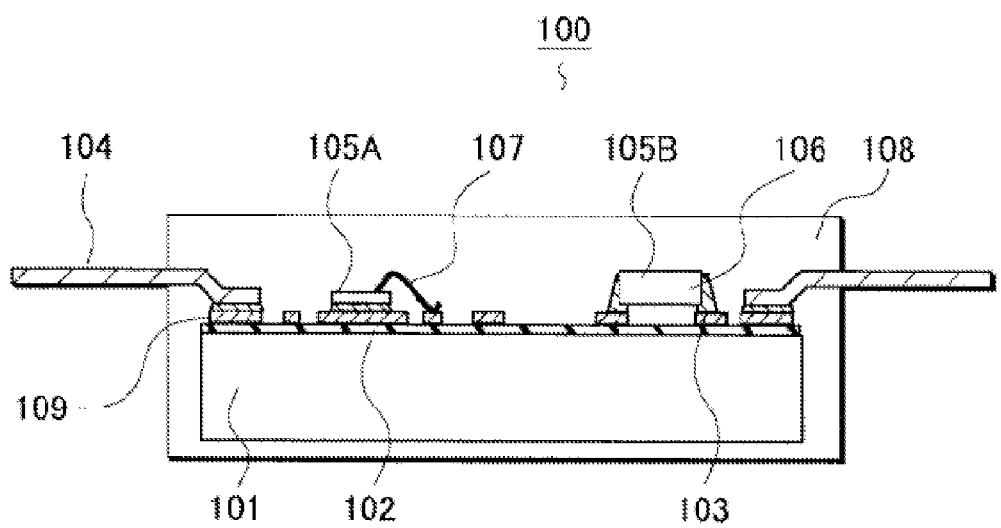
FIG. 6 is a cross-sectional view for explaining a conventional hybrid integrated circuit device.

Thereafter, a sealing resin 14 is formed to cover the circuit boards as shown in FIGS. 5A and 5B. FIG. 5A is a cross-sectional view showing a step of molding the circuit board 11A with a die. FIG. 5B is a plan view showing the lead frame 40 after the molding.

As shown in FIG. 5A, firstly, the circuit board 11A is accommodated in a cavity 23 formed by an upper die 22A and a lower die 22B. In this cross-sectional view, illustrated is the one circuit board 11A. In practice, the three circuit boards 11A, 11B, and 11C are disposed in the single cavity 23, and integrally sealed with the sealing resin 14.

By causing the leads 25 to abut the upper die 22A and the lower die 22B, the positions of the circuit boards 11A and the like are fixed inside the cavity 23. Then, the circuit boards are sealed by injecting a resin into the cavity 23 from an unillustrated gate provided in the die. At this point, as the sealing resin 14 is injected into the cavity 23, the air in the cavity 23 is released to the outside through the unillustrated gate. In this step, the circuit boards are sealed by transfer molding with a thermosetting resin or by injection molding with a thermoplastic resin.

After the molding step described above is completed, the leads 25 are separated from the lead frame 40 as shown in FIG. 5B. Specifically, the leads 25 are separated individually at the positions on the tie-bars 44, and a hybrid integrated circuit device 10 as shown in FIG. 1 is separated from the lead frame 40. In this embodiment, the three circuit boards 11A, 11B and, 11C are built in the sealing resin 14.

In the circuit device according to the present invention, the electronic circuits including the conductive patterns and the circuit elements are formed on the respective top surfaces of the multiple circuit boards. Thereby, the circuit elements disposed on the different boards do not adversely influence each other. Therefore, it is possible to stabilize the operation of the electronic circuits formed in the circuit device.

In the method of fabricating a circuit device according to the present invention, the circuit device is fabricated by combining the multiple circuit boards having the electronic circuits incorporated in the surfaces thereof. Thereby, even when a modification is made to the electronic circuits built in the circuit device, it is only necessary to alter the combination of the circuit boards to deal with the modification. Therefore, the cost due to the modification of the electronic circuits is reduced.

What is claimed is:

1. A circuit device, comprising:
   a plurality of circuit boards;
   said circuit boards each having an electronic circuit, including a conductive pattern and a circuit element which are formed on the top surface of each of the circuit boards; and
   said circuit boards each having a lead, which is electrically connected to the electronic circuit, and which is led out to the outside,
   sealing resin integrally supporting a plurality of the circuit boards, wherein
   the plurality of the circuit boards are provided independently of each other, and
   the conductive pattern, the circuit element and the lead are provided to each of the circuit boards, with the respective leads fixed on each of the circuit boards leading out from the sealing resin to the outside of the sealing resin;

a lower surface of the circuit boards is covered by the sealing resin.

2. The circuit device according to claim 1, wherein the electronic circuit formed on the independent circuit boards are electrically connected to each other with a connecting member.

3. The circuit device according to claim 2, wherein the connecting member is a thin metal wire.

4. The circuit device according to claim 1, wherein at least one of the circuit boards is provided with a connecting portion which connects the conductive pattern and the circuit board.

5. The circuit device according to claim 1, wherein the circuit element includes a control element and a switching element controlled by the control element, and the control element is mounted on a different one of the circuit boards from that on which the switching element is mounted.

6. The circuit device according to claim 1, wherein a plurality of the circuit boards is disposed on the same plane.

7. The circuit device according to claim 1, wherein the circuit boards to be built in are disposed separately from each other.

8. The circuit device according to claim 1, wherein a lower surface of the circuit board is entirely covered by the sealing resin which extends entirely over said lower surface of the circuit board.

9. The circuit device according to claim 1, wherein a lower surface of the circuit board is covered by the sealing resin which extends over at least a portion of said lower surface in such a manner that at least a portion of the lower surface is not exposed from the sealing resin.

10. The device of claim 1, wherein each of said circuit boards has a plurality of said leads extending generally parallel to one another, and said plurality of leads of a first of said circuit boards are arranged such as to extend in a direction towards an adjacent second of said circuit boards and generally parallel to said plurality of leads of said second circuit board, and wherein said plurality of leads of each of said first and second circuit boards extend outside said sealing resin between said first and second circuit boards.

11. The device of claim 1, wherein said plurality of circuit boards includes at least three circuit boards arranged side-by-side one another, which each of said circuit boards including leads fixed thereon and leading out from the sealing resin to the outside of the sealing resin.

12. A method of fabricating a circuit device, comprising the steps of:
preparing a lead frame provided with units including a plurality of leads;
forming an electronic circuit including a conductive pattern and a circuit element on the top surface of a plurality of circuit boards;
connecting the plurality of the circuit boards to the leads provided in one of the units thereby to cause the lead frame to hold the circuit boards mechanically; and
integrally covering the plurality of circuit boards with a sealing resin, including covering a lower surface of the circuit boards with said sealing resin, and with the respective leads fixed on each of the circuit boards leading out from the sealing resin to the outside of the sealing resin.

13. The method of fabricating a circuit device according to claim 12, wherein a pad formed of the conductive pattern is disposed on the surface of the circuit board, and each lead is fixed to the pad with a fixing member thereby to fix the circuit board to the lead frame.

14. The method of fabricating a circuit device according to claim 12, wherein the electronic circuits formed on the different circuit boards are connected to each other with a thin metal wire.

15. The method of fabricating a circuit device according to claim 12, wherein said covering said lower surface of the circuit board by the sealing resin includes that said sealing resin extends entirely over said lower surface of the circuit board.

16. The method of fabricating a circuit device according to claim 12, wherein said covering said lower surface of the circuit board by the sealing resin includes that said sealing resin extends over at least a portion of said lower surface in such a manner that at least a portion of the lower surface is not exposed from the sealing resin.

17. The method of claim 12, wherein each of said circuit boards has a plurality of said leads extending generally parallel to one another, and said plurality of leads of a first of said circuit boards are arranged such as to extend in a direction towards an adjacent second of said circuit boards and generally parallel to said plurality of leads of said second circuit board, and wherein said plurality of leads of each of said first and second circuit boards extend outside said sealing resin between said first and second circuit boards.

18. The method of claim 12, wherein said plurality of circuit boards includes at least three circuit boards arranged side-by-side one another, which each of said circuit boards including leads fixed thereon and leading out from the sealing resin to the outside of the sealing resin.

* * * * *